United States Patent
Ebner

(10) Patent No.: US 6,762,628 B2
(45) Date of Patent: Jul. 13, 2004

(54) METHOD FOR OPERATING A COMPARATOR AND A PRE-AMPLIFIER OF AN INTEGRATED CIRCUIT, WHICH PRE-AMPLIFIER IS CONNECTED IN SERIES TO THE COMPARATOR, AS WELL AS AN INTEGRATED CIRCUIT ARRANGEMENT COMPRISING A COMPARATOR AND A PRE-AMPLIFIER WHICH IS CONNECTED IN SERIES TO THE COMPARATOR

(75) Inventor: Christian Ebner, München (DE)

(73) Assignee: Xignal Technologies AG, Unterhaching (DE)

( * ) Notice: Subject to any disclaimer, the term of this patent is extended or adjusted under 35 U.S.C. 154(b) by 0 days.

(21) Appl. No.: 10/382,620

(22) Filed: Mar. 7, 2003

(65) Prior Publication Data

US 2003/0169079 A1 Sep. 11, 2003

(30) Foreign Application Priority Data

Mar. 9, 2002 (DE) .......................................... 102 11 013

(51) Int. Cl.⁷ ................................................ H03K 5/22
(52) U.S. Cl. .......................................... 327/63; 327/65
(58) Field of Search ............................... 327/63–65, 77, 327/89, 560–563

(56) References Cited

U.S. PATENT DOCUMENTS 4,241,455 A       12/1980   Eibner
6,611,163 B1 *    8/2003    Mukherjee et al. ......... 327/337

OTHER PUBLICATIONS

David Johns et al., "Analog Integrated Circuit Design", J. Wiley & Sons, 1997, pp. 316–331.
Nagaraj et al., IEEE Journal of Solid–State Circuits, vol. 35, No. 12, Dec. 2000, pp. 1760–1768.
Razavi et al., IEEE Journal of Solid–State Circuits, vol. 27, No. 12, Dec. 1992, pp. 1916–1926.

Oehler, F., et al., A3,6 Gigasample/s 5 bit Analog to Digital Converter using 0.3 μm AL GaAs–HEMT Technology, in IEEE, GaAs IC Symposium 1993, pp. 163–166.

* cited by examiner

Primary Examiner—Kenneth B. Wells
(74) Attorney, Agent, or Firm—Rothwell, Figg, Ernst & Manbeck, P.C

(57) ABSTRACT

The invention relates to a method for operating a comparator (10) and a pre-amplifier (20) of an integrated circuit, which pre-amplifier is connected in series to the comparator, wherein the comparator (10) is operated with clock pulses in order to compare comparator input signals at periodical decision points (t2), wherein the pre-amplifier (20) is operated with clock pulses so as, in amplification phases (t1 to t2) which precede the decision points (t2), to amplify a signal (IN) which has been input to the pre-amplifier, and to provide the amplified signal (OUT) as a comparator input signal, and so as, in reset phases (t0 to t1) which precede the amplification phases (t1 to t2), to reset the amplification (G) to a minimum value. According to the invention, the pre-amplifier (20) is operated such that its amplification (G) during a rise phase within the amplification phase (t1 to t2) rises gradually and uniformly from the minimum value to a maximum value. The invention thus makes possible operation of the pre-amplifier with low current consumption and yet with an output signal which ensures that the comparator makes a reliable decision.

16 Claims, 2 Drawing Sheets

METHOD FOR OPERATING A COMPARATOR AND A PRE-AMPLIFIER OF AN INTEGRATED CIRCUIT, WHICH PRE-AMPLIFIER IS CONNECTED IN SERIES TO THE COMPARATOR, AS WELL AS AN INTEGRATED CIRCUIT ARRANGEMENT COMPRISING A COMPARATOR AND A PRE-AMPLIFIER WHICH IS CONNECTED IN SERIES TO THE COMPARATOR

BACKGROUND OF THE INVENTION

1. Field of the Invention

The invention relates to a method for operating a comparator and a pre-amplifier of an integrated circuit, which pre-amplifier is connected in series to the comparator, according to the precharacterising part of claim 1, as well as to an integrated circuit arrangement comprising a comparator and a pre-amplifier which is connected in series to the comparator, according to the precharacterising part of claim 9.

2. Description of the Prior Art

Such a method and such a circuit arrangement is for example known from "Razavi et al, IEEE Journal of Solid-state Circuits, vol. 27, no. 12, December 1992, pp. 1916–1926". FIG. 1 of said article diagrammatically shows a comparator with a pre-amplifier connected in series. FIGS. 5 and 6 of said article show embodiments of a pre-amplifier which can be operated with clock pulses, and of a comparator (latch) which can be operated with clock pulses. By means of suitably selected periodical clock pulse signals for controlling the pre-amplifier and the comparator, this arrangement makes it possible, at periodical decision points, to compare the signals which are present at the input of the arrangement.

From "Nagaraj et al, IEEE Journal of Solid-state Circuits, vol. 35, no. 12, December 2000, pp. 1760–1768", a similar circuit arrangement is known. FIG. 6 of said article shows the arrangement in an ADC, wherein two pre-amplifier stages are connected in series to individual comparators (latches). FIGS. 8 and 11 of this article show the design of the first pre-amplifier stage and the periodical signal gradients of the pre-amplifier stages which are operated with clock pulses.

From "David Johns, Ken Martin, Analog Integrated Circuit Design, J. Wiley & Sons, 1997, pp. 316–331 (compare FIG. 7.13 of said article), it is know to connect a pre-amplifier in series to a comparator.

FIG. 1 shows an arrangement, designed in the known way, comprising a comparator 10 and a pre-amplifier 20 which has been connected in series to the comparator 10 so as to improve the resolution. As is also shown in FIG. 1, it is also possible to connect several pre-amplifiers in series to the comparator 10.

By being controlled with a periodical clock pulse signal CLK, the comparator 10 is operated so as to compare comparator input signals at periodical decision points, wherein said comparator input signals are provided to the comparator 10 by the pre-amplifier 20 in the form of output signals OUT+ and OUT-. At its output, the comparator 10 provides a comparator output signal which corresponds to the comparison result, namely a binary signal COUT and a signal COUT* which is inverse to the former. The pre-amplifier 20 (or the multiple number of pre-amplifiers) is/are operated by being controlled with a further periodical clock pulse signal (RST) (reset signal) so as, in amplification phases which precede the decision points, to amplify a signal which has been input to the pre-amplifier (in this instance the difference between two signals IN+ and IN-) and to provide the amplified signal as a comparator input signal (difference between signals OUT+ and OUT-), and so as, in reset phases which precede the amplification phases, to reset amplification to a minimum value (reset). This reset function prevents hysteresis effects as well as dependence of the output signals OUT+, OUT- on the past history of these signals in preceding clock pulse cycles. Preferably, the minimum value of amplification is significantly less than 1.

FIG. 2 shows an exemplary embodiment of the pre-amplifier 20. A pre-amplifier designed in this way is for example known from the above-mentioned IEEE article (Nagaraj et al) and is shown in FIG. 8 of said article. The pre-amplifier comprises a transconductance stage which is formed from a differential pair of two FETs Q1, Q2, as well as a resistive load in the form of ohmic resistors R1, R2, arranged in series to the FETs Q1, Q2. As an alternative, the resistive load could for example also be formed by MOS diodes.

The differential input signals IN+, IN- are fed to the control-current terminals of the FETs Q1, Q2, so that on nodes between these FETs and the resistors R1, R2, the amplified signal is provided as the difference between two signals OUT+, OUT-, wherein, as is well known, amplification is greater the greater the transconductance in the transconductance stage, and the greater the resistive load.

A time constant (RC constant) is decisive for the dynamic behaviour of the pre-amplifier 20, with said time constant being the product from resistive load and capacities. Such capacities, above all parasitic capacities, are unavoidable at the output of the pre-amplifier 20 itself and as a result of the input capacity of the subsequent stage (comparator or further pre-amplifier).

The reset function of the pre-amplifier 20, which is clock pulsed with the reset signal RST, takes place by means of a further FET Q3, which is arranged between pre-amplifier output lines which are intended for providing the amplified signal, with said further FET Q3 being operated as a switch, in that the binary reset signal RST is fed to the control-current terminal of said FET Q3. During a reset phase the FET Q3 is switched on so that the pre-amplifier output lines are short-circuited by way of a relatively small source-drain resistor. As a result of this, amplification is reset to a minimum value (approaching zero), while the time constant also becomes small, so that consequently the output signal OUT+–OUT- quickly drops to values near zero. This reset function prevents hysteresis effects and during the reset phase clears any signal excursion which may still be present at the output so that in the next clock pulse cycle the output signal does not depend on the past history.

During an amplification phase which immediately follows the reset phase, the output signal of the pre-amplifier 20 should follow the input signal (which is variable in time). At the end of the amplification phase, i.e. at the decision point of the comparator 10, the output signal has to be at least on the same side of the decision threshold as the input signal so as to ensure a reliable comparison function. In many cases of application, the characteristics of the input signal are such that, from a starting value which does not correlate to the final value, or only faintly correlates to the final value (e.g. along an exponential transient response curve), said input signal aims to reach the final value. This case occurs in particular at the output of an SC (switched-capacitor) circuit, for example in the context of quantisers in delta-sigma modulators. The case where the input signal starts with considerable excursion on one side of the decision threshold and changes to the other side only towards the end of the amplification phase constitutes the most difficult case for designing the amplifier time constant. This case is shown in FIG. 3. The solid curve shows the gradient over time of the input signal. If the pre-amplifier 20 is designed for a short time constant and thus high speed, approximately the output signal gradient shown by a dot-dash line in FIG. 3 results. If the pre-amplifier 20 is designed for a longer time constant and thus a lower speed, approximately the output signal gradient shown by a dashed line in FIG. 3 results. In the first case, the final value of the output signal is on the same side as the decision threshold (dotted line), whereas in the second case, the output signal of the pre-amplifier 20 cannot follow the input signal fast enough and is still located on the other side of the decision threshold. If this second case is to be avoided, the time constant will have to be shortened. This can easily be brought about by reducing the resistive load. In practical application it is rarely possible to reduce the capacities which are decisive for the time constant. As a rule, these capacities result as parasitic capacities due to less than perfect matching of circuit components.

In order to maintain unchanged the amplification which is to be achieved when the resistive load is reduced, it is however subsequently necessary to increase the transconductance of the transconductance stage. In the pre-amplifier 20 shown in FIG. 2 this means an increase of the FET bias current, i.e. of the current which flows without an input signal through the FETs Q1 and Q2. As is well known, the magnitude of the transconductance of a FET directly depends on the magnitude of this bias current.

Thus, if the pre-amplifier 20 is designed for an input signal which varies over time, which aims to reach the final value only during the amplification phase, wherein it should be ensured that the output signal follows the input signal at adequate speed, then the current consumption of the pre-amplifier must be clearly increased when compared to the case of a constant input signal.

From "Oehler, F. et al, A 3.6 Gigasample/s 5 bit Analog to Digital Converter using 0.3 μm AlGaAs-HEMT Technology, in IEEE, GaAs IC Symposium 1993, pp. 163–166" it is known to connect in series a continuously operated pre-amplifier to a comparator which is operated with clock pulses.

U.S. Pat. No. 4,241,455 describes a circuit arrangement for receiving and processing signals which were input to the circuit by way of an optical detector. These are digital data signals which are processed by the circuit arrangement by means of a number of processing stages, with comparators being used at the end of said processing stages. A pre-amplifier of this known circuit arrangement is in continuous operation.

SUMMARY OF THE INVENTION

It is an object of the present invention to eliminate the disadvantages stated above, and in particular to provide a circuit arrangement and a method of the type described in the introduction, in which the pre-amplifier, even with low current consumption, at the decision point of the comparator provides output signals which are suitable for making a reliable decision.

This object is met by a method according to claim 1, and a circuit arrangement according to claim 9. The dependent claims relate to advantageous improvements of the invention.

It is essential to the invention that amplification during a rise phase within the amplification phase rises uniformly and gradually from the minimum value to a maximum value. In most application cases this rise phase preferably takes up at least 10%, more preferably at least 50% of the amplification phase.

The function of the invention can be mathematically explained by means of a linear model of the pre-amplifier, as follows. The final value (at the end of the amplification phase) of the output signal can be obtained from a convolution of the input signal with the pulse response of the pre-amplifier. The slower the amplifier, the greater the contribution which the fractions of the input signals at the beginning of the amplifier phase make to the final value of the output signal. The invention is based on the fundamental idea of influencing the form of the pulse response (weight function) by providing amplification which is variable over time. By means of a suitable selection of the gradient over time of the size of the resistive load, the form of the pulse response can be changed over an extended region. By providing a rise phase in which amplification rises, it is possible to more or less "decouple" the objectives of providing a reliable output signal at the end of the amplification phase while achieving low current consumption of the pre-amplifier (i.e. objectives which are competing in the state of the art), and to provide a pre-amplifier with lower current consumption in which the starting value (at the beginning of the amplification phase) of the input signal makes a small contribution to the final value of the output signal, whereas input signals at the end of the amplification phase make a comparatively large contribution to the output signal at the decision point.

BRIEF DESCRIPTION OF THE DRAWINGS

Below, the invention is described by means of an exemplary embodiment, with reference to the enclosed drawings. The following are shown.

DESCRIPTION OF THE PREFERRED EMBODIMENT(S)

Figure 1:
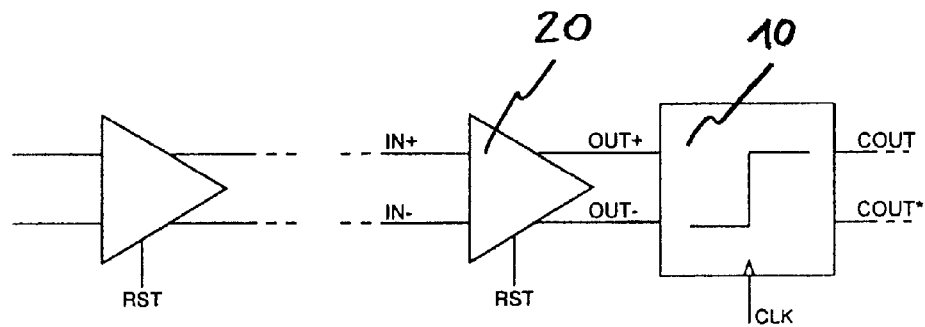
FIG. 1 a block diagram of an arrangement comprising one or several pre-amplifiers which are connected in series to a comparator, according to the state of the art.
Figure 2:
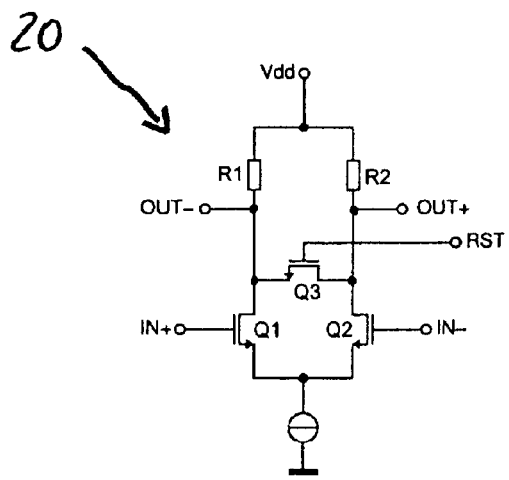
FIG. 2 a connection diagram of one of the pre-amplifiers shown in FIG. 1.
Figure 3:
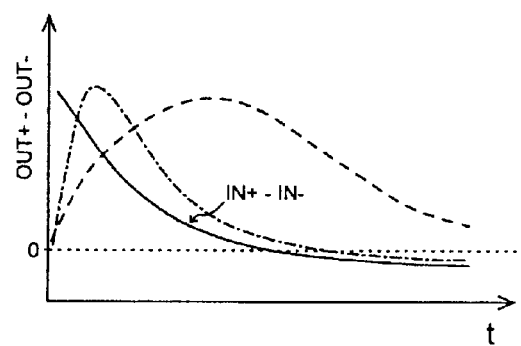
FIG. 3 the gradient over time of an input signal as well as of an output signal of the pre-amplifier according to FIG. 2 for differing designs (time constants) of the pre-amplifier.

The exemplary embodiment of the invention as described below relates to the embodiment and application of a pre-amplifier which has already been described above with reference to FIGS. 1, 2 and 3.

FIG. 4 again shows the already described pre-amplifier 20 which is connected in series to a comparator (not shown in FIG. 4). The design and operation of the pre-amplifier 20 have already been described in detail above. Express reference is made to this description. With the known control of the pre-amplifier 20 using a periodical and rectangular reset signal, in the case of a design of the pre-amplifier 20 which design is relatively economical from the point of view of current consumption, the time gradients of amplification G and of the input signals and output signals IN+, IN− and OUT+, OUT− as shown in FIGS. 5a and 5b would result. During a reset phase in the time range between t0 and t1, this amplification G is at a minimum value, while in an amplification phase in a time range between t1 and t2 the amplification G is at a maximum value. At the point in time t1, the amplification G suddenly changes its value. The reset phase, together with the subsequent amplification phase, forms a clock pulse cycle of periodically controlling the pre-amplifier so that the point in time t2, which is the end of the amplification phase, at the same time represents the point in time t0 which is the beginning of the reset phase of the next clock pulse cycle. The period extends from t0 to t2. FIG. 5b shows that as a result of a long time-constant, the output signal OUT+−OUT−, follows the input signal IN+−IN− relatively slowly so that at the end of the amplification phase, at t2 there is generally no output signal which would make it possible for the comparator to make a reliable decision.

FIGS. 5c and 5d show the corresponding gradient over time for operation, according to the invention, of the circuit arrangement. Within the amplification phase from t1 to t2 there is a rise phase (compare FIG. 5c) during which amplification G of the pre-amplifier 20 rises in a controlled uniform way from the minimum value set in the reset phase to the amplification maximum value. In the example shown, this rise is linear across the entire rise phase, wherein the maximum value of amplification is already achieved before the end of the amplification phase and remains constant over a terminal amplification phase which takes up approximately 10% of the amplification phase. The rise which is at least approximately linear, can be reproduced particularly well and is simple to realise from the point of view of control technology. It would for example also be thinkable to have a constant rise with a different gradient or a non-constant rise in several stages. The terminal amplification phase where amplification is at its maximum, ensures that the weighting of the input signal fraction is heavy immediately prior to the point in time at which the comparator makes a decision.

Figure 4:
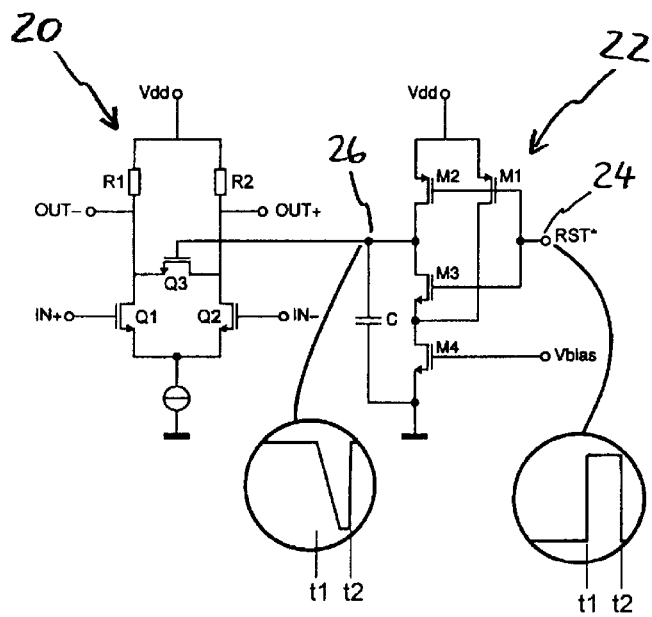
FIG. 4 a connection diagram of a pre-amplifier with an associated signal transformation circuit for forming a control signal for the pre-amplifier according to the invention.
Figure 5:
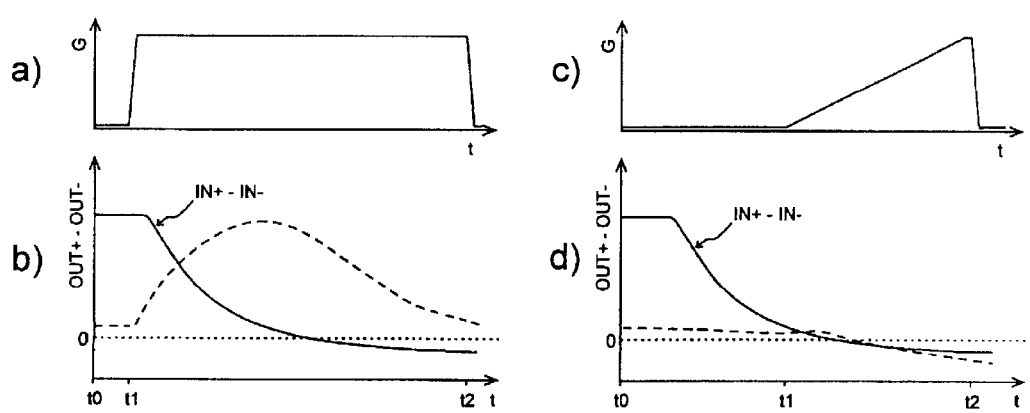
FIG. 5 a comparison of gradients over time of amplification as well as of the input signal and output signal in a pre-amplifier according to the state of the art (FIGS. 5a and 5b) and in a pre-amplifier according to the invention (FIGS. 5c and 5d).

The right part of FIG. 4 shows an embodiment of a signal transformation circuit 22 which makes possible the control of the pre-amplifier 20, which control is necessary to achieve the amplification shown in FIG. 5c. This circuit 22 forms part of a control device (not shown) by means of which the clock pulse signals (CLK, RST, RST*) are provided.

Here, the reset signal RST which is used in known circuit arrangements is no longer used for switching on the reset transistor Q3 during the reset phase and for switching it off during the amplification phase. Instead, the FET Q3 is now controlled in such a way that at the beginning of the amplification phase it is gradually switched off and that thus the amplification of the pre-amplifier 20 increases relatively slowly until, at the end of this rise phase, the maximum value of amplification is reached. Again, the logic signal RST controls clock pulsing of the pre-amplifier 20. At an input node 24, the inverted reset signal RST* is input and supplied to the control connections of the FETs M1, M2 and M3. The control connection of a further FET M4 is supplied with a predetermined constant bias voltage. Starting from an upper supply voltage Vdd, the FETs M2, M3 and M4 are arranged in this order, in series, between the supply potential Vdd and a lower supply potential. The FET M1 is arranged parallel to the series connection which comprises the FETs M2 and M3, and a capacitor C, one connection of which is connected to the lower supply potential and the other connection of which forms an output node 26 of the circuit 22, is arranged parallel to the series connection which comprises M3 and M4. At this output node 26, the control signal is provided which determines the amplification of the pre-amplifier 20 and which supplies the control connection of the FET Q3.

As long as the reset signal RST has a high level and accordingly the inverted reset signal RST* has a low level (reset phase), M2 conducts, and the control voltage for Q3, which control voltage has been provided by way of output node 26, remains at the upper supply voltage Vdd, so that Q3 conducts. When RST* changes to the high level (t1), M2 blocks while M3 conducts. In this way, the capacitor C, which during the reset phase was charged by way of M2, is now slowly discharged by way of the conducting FET M3 and the FET M4. In this arrangement M4 serves as a current setting element which is set by means of the bias voltage Vbias. It would be imaginable, instead of M4, to use another current setting means (e.g. resistor element such as an ohmic resistor). In this phase, the constant bias voltage of M4 in this arrangement causes a linear drop in the voltage at capacitor C, so that the control voltage made available to Q3 slowly decreases while amplification of the pre-amplifier 20 gradually increases. The components of the circuit 22 are designed such that the minimum value of the control voltage (lower supply voltage) and, correspondingly, the maximum value of amplification are reached before the signal RST* changes again (t2, beginning of the next clock pulse cycle).

The FET M1 is dispensable, per se, for the function of the circuit 22. Here it merely serves the purpose of keeping the FET M4 saturated even if M3 blocks. This is advantageous in view of the achievable rise speed at the beginning of the amplification phase.

Within the scope of this invention, the pre-amplifier 20 can of course be replaced by a serial arrangement of several pre-amplifiers whose design and control is identical, in particular as is the case in the amplifier 20 described above.

What is claimed is:

1. A method for operating a comparator (10) and a pre-amplifier (20) of an integrated circuit, which pre-amplifier is connected in series to the comparator, wherein the comparator (10) is operated with clock pulses in order to compare comparator input signals at periodical decision points (t2) and to provide a comparator output signal (COUT) which corresponds to the comparison result, wherein the pre-amplifier (20) is operated with clock pulses so as, in amplification phases (t1 to t2) which precede the decision points (t2), to amplify a signal (IN) which has been input to the pre-amplifier, and to provide the amplified signal (OUT) as a comparator input signal, and so as, in reset phases (t0 to t1) which precede the amplification phases (t1 to t2), to reset the amplification (G) to a minimum value, characterised in that the pre-amplifier (20) is operated such that its amplification (G) during a rise phase within the amplification phase (t1 to t2) rises uniformly and gradually from the minimum value to a maximum value.

2. The method according to claim 1, wherein a voltage signal is used as a signal (IN) to be amplified, with said voltage signal being supplied to a transconductance stage (Q1, Q2), and wherein the amplified signal (OUT) is provided on a resistive load (R1, R2) to the transconductance stage.

3. The method according to claim 1, implemented in an integrated circuit produced in CMOS technology, wherein pre-amplifier output lines, which are intended for providing the amplified signal (OUT), are interconnected by way of the channel of a FET (Q3), wherein the control-current terminal of the FET (Q3) is supplied with a control signal which determines the amplification, with said control signal during the reset phase (t0 to t1) having a first value (Vdd) in order to reset the amplification (G) to the minimal value, and amplification (G) during the rise phase changes to a second value in order to let amplification rise to the maximum value.

4. The method according to claim 1, wherein a control signal which determines the amplification (G) is provided as a voltage signal at a capacitor (C) which during the rise phase is charged or discharged by means of a resistor element.

5. The method according to claim 4, wherein the channel of a FET (M4) is used as a resistor element, with the control-current terminal of said FET, at least during the rise phase, being supplied with a predetermined bias voltage (Vbias).

6. The method according to claim 1, wherein the amplification (G) is allowed to rise in an approximately linear way at least over part of the rise phase.

7. The method according to claim 1, wherein the maximum value of the amplification (G) is achieved before the end of the amplification phase (t1 to t2), and amplification remains approximately constant over a terminal amplification phase, wherein the terminal amplification phase takes up at least 10% of the amplification phase (t1 to t2).

8. The method according to claim 1, wherein an SC circuit is connected in series to the pre-amplifier (20), in particular in a sigma-delta converter.

9. An integrated circuit arrangement comprising a comparator (10) and a pre-amplifier (20) which is connected in series to the comparator, as well as comprising a control device, wherein the control device operates the comparator (10) with clock pulses in order to compare comparator input signals at periodical decision points (t2) and to provide a comparator output signal (COUT) which corresponds to the comparison result, and wherein the control device operates the pre-amplifier (20) with clock pulses so as, in amplification phases (t1 to t2) which precede the decision points (t2), to amplify a signal (IN) which has been input to the pre-amplifier and to provide the amplified signal (OUT) as a comparator input signal, and so as, in reset phases (t0 to t1) which precede the amplification phases (t1 to t2), to reset the amplification (G) to a minimum value, characterised in that the control unit is designed to operate the pre-amplifier (20) such that its amplification (G) during a rise phase within the amplification phase (t1 to t2) rises uniformly from the minimum value to a maximum value, and in that this rise phase takes up at least 10% of the amplification phase.

10. The circuit arrangement according to claim 9, wherein the pre-amplifier (20) comprises a transconductance stage (Q1, Q2) to which the signal (IN) to be amplified is supplied as a voltage signal, and wherein the amplified signal (OUT) is provided on a resistive load (R1, R2) to the transconductance stage.

11. The circuit arrangement according to claim 9, produced in CMOS technology, wherein pre-amplifier output lines, which are intended for providing the amplified signal (OUT), are interconnected by way of the channel of a FET (Q3), wherein the control-current terminal of the FET (Q3) is supplied by the control device with a control signal which determines the amplification (G).

12. The circuit arrangement according to claim 9, wherein the control device comprises a capacitor (C), at which a control signal which determines the amplification (G) is provided as a voltage signal, wherein the capacitor (C) during the rise phase is charged or discharged by means of a resistor element arranged in series or in parallel to the capacitor.

13. The circuit arrangement according to claim 12, wherein the resistor element represents the channel of a FET (M4).

14. The circuit arrangement according to claim 9, wherein the resistor element is designed such that the amplification (G) is allowed to rise in an approximately linear way at least over part of the rise phase.

15. The circuit arrangement according to claim 9, wherein the control unit is designed so that the maximum value of the amplification (G) is achieved before the end of the amplification phase (t1 to t2), and amplification remains approximately constant over a terminal amplification phase, wherein the terminal amplification phase takes up at least 10% of the amplification phase (t1 to t2).

16. The integrated circuit arrangement according to claim 9, wherein an SC circuit is connected in series to the pre-amplifier (20), in particular in a sigma-delta converter.

* * * * *